United States Patent
Masleid et al.

(10) Patent No.: US 7,663,408 B2
(45) Date of Patent: Feb. 16, 2010

(54) SCANNABLE DYNAMIC CIRCUIT LATCH

(76) Inventors: Robert Paul Masleid, 17266 Eaton La., Monte Sereno, CA (US) 95930; Jose Sousa, 210 Moresby La., Redwood City, CA (US) 94063; Venkata Kottapalli, 1662 Hollenbeck Ave., Apt. #14, Sunnyvale, CA (US) 94087

( * ) Notice: Subject to any disclaimer, the term of this patent is extended or adjusted under 35 U.S.C. 154(b) by 82 days.

(21) Appl. No.: 11/171,695

(22) Filed: Jun. 30, 2005

(65) Prior Publication Data
US 2007/0008012 A1    Jan. 11, 2007

(51) Int. Cl.
  *H03K 19/173*  (2006.01)
  *G06F 7/38*    (2006.01)
  *H03K 19/094*  (2006.01)
  *H03K 19/20*   (2006.01)

(52) U.S. Cl. .......................................... 326/112; 326/50
(58) Field of Classification Search ................. 326/121, 326/56–58
See application file for complete search history.

(56) References Cited

U.S. PATENT DOCUMENTS

| | | |
|---|---|---|
| 3,991,380 A | 11/1976 | Pryor |
| 4,739,252 A | 4/1988 | Malaviya et al. |
| 5,128,560 A | 7/1992 | Chern et al. |
| 5,264,738 A | 11/1993 | Veendrick et al. |
| 5,297,086 A | 3/1994 | Nasu et al. |
| 5,410,278 A | 4/1995 | Itoh et al. |
| 5,453,708 A | 9/1995 | Gupta et al. |
| 5,467,038 A | 11/1995 | Motley et al. |
| 5,525,916 A | 6/1996 | Gu et al. |
| 5,568,103 A | 10/1996 | Nakashima et al. |
| 5,594,360 A | 1/1997 | Wojciechowski et al. |
| 5,610,548 A | 3/1997 | Masleid |
| 5,677,650 A | 10/1997 | Kwasniewski et al. |
| 5,680,359 A | 10/1997 | Jeong et al. |
| 5,764,110 A | 6/1998 | Ishibashi et al. |
| 5,796,313 A | 8/1998 | Eitan et al. |
| 5,811,983 A | 9/1998 | Lundberg et al. |
| 5,880,608 A | 3/1999 | Mehta et al. |
| 5,963,043 A | 10/1999 | Nassif |
| 5,977,763 A | 11/1999 | Loughmiller et al. |
| 5,982,211 A | 11/1999 | Ko et al. |
| 6,011,403 A | 1/2000 | Gillette et al. |
| 6,025,738 A | 2/2000 | Masleid |

(Continued)

FOREIGN PATENT DOCUMENTS

EP    1398639    3/2004

(Continued)

OTHER PUBLICATIONS

Yuan et al. "New domino logic precharged by clock and data" Electronic Letters—vol. 29, No. 25, pp. 2188-2189. Published Dec. 9, 1993.*

(Continued)

*Primary Examiner*—Vibol Tan
*Assistant Examiner*—Matthew C Tabler

(57) ABSTRACT

A dynamic circuit latch, having the functionality of a domino circuit and a transparent latch, without the delay associated with the inclusion of a separate series latch element. Embodiments include a fast scannable footed Domino dyanmic latch. Also described is a fast scannable delay reset Domino dynamic latch. A fast scannable compound Domino dynamic latch is also described.

29 Claims, 6 Drawing Sheets

Dynamic Circuit Latch 600

U.S. PATENT DOCUMENTS

| | | | |
|---|---|---|---|
| 6,028,490 A | 2/2000 | Komatsu et al. | |
| 6,031,403 A | 2/2000 | Gersbach et al. | |
| 6,087,886 A | 7/2000 | Ko et al. | |
| 6,127,872 A | 10/2000 | Kumata et al. | |
| 6,133,759 A | 10/2000 | Beck et al. | |
| 6,154,045 A | 11/2000 | Ye et al. | |
| 6,154,099 A | 11/2000 | Suzuki et al. | |
| 6,154,100 A | 11/2000 | Okamoto et al. | |
| 6,172,943 B1 | 1/2001 | Yuzuki et al. | |
| 6,188,259 B1 | 2/2001 | Amir et al. | |
| 6,188,260 B1 | 2/2001 | Stotz et al. | |
| 6,229,747 B1 | 5/2001 | Cho et al. | |
| 6,242,936 B1 | 6/2001 | Ho et al. | |
| 6,242,937 B1 | 6/2001 | Lee et al. | |
| 6,281,706 B1 | 8/2001 | Wert et al. | |
| 6,407,571 B1 | 6/2002 | Furuya et al. | |
| 6,426,641 B1 | 7/2002 | Koch et al. | |
| 6,455,901 B2 | 9/2002 | Kameyama et al. | |
| 6,466,063 B2 | 10/2002 | Chen | |
| 6,476,632 B1 | 11/2002 | La Rosa et al. | |
| 6,489,796 B2 | 12/2002 | Tomishima | |
| 6,535,014 B2 | 3/2003 | Chetlur et al. | |
| 6,538,471 B1 | 3/2003 | Stan et al. | |
| 6,538,522 B1 | 3/2003 | Aipperspash et al. | |
| 6,545,519 B1 * | 4/2003 | Carballo | 327/211 |
| 6,570,407 B1 * | 5/2003 | Sugisawa et al. | 326/93 |
| 6,577,157 B1 | 6/2003 | Cheung et al. | |
| 6,577,176 B1 | 6/2003 | Masleid et al. | |
| 6,621,318 B1 | 9/2003 | Burr | |
| 6,630,851 B2 | 10/2003 | Masleid | |
| 6,657,504 B1 | 12/2003 | Deal et al. | |
| 6,664,807 B1 | 12/2003 | Crotty et al. | |
| 6,690,242 B2 | 2/2004 | Fang et al. | |
| 6,697,929 B1 | 2/2004 | Cherkauer et al. | |
| 6,724,214 B2 | 4/2004 | Manna et al. | |
| 6,731,140 B2 | 5/2004 | Masleid et al. | |
| 6,731,179 B2 | 5/2004 | Abadeer et al. | |
| 6,759,863 B2 | 7/2004 | Moore | |
| 6,762,966 B1 | 7/2004 | LaRosa et al. | |
| 6,774,734 B2 | 8/2004 | Christensen et al. | |
| 6,798,230 B1 | 9/2004 | Taylor et al. | |
| 6,815,971 B2 | 11/2004 | Wang et al. | |
| 6,815,977 B2 * | 11/2004 | Sabbavarapu et al. | 326/16 |
| 6,831,494 B1 | 12/2004 | Fu et al. | |
| 6,850,103 B2 * | 2/2005 | Ikeno et al. | 327/202 |
| 6,882,172 B1 | 4/2005 | Suzuki et al. | |
| 6,885,210 B1 | 4/2005 | Suzuki | |
| 6,903,564 B1 | 6/2005 | Suzuki | |
| 6,956,405 B2 | 10/2005 | Lundberg | |
| 7,053,680 B2 | 5/2006 | Masleid et al. | |
| 7,076,682 B2 | 7/2006 | Jacobson | |
| 7,119,580 B2 | 10/2006 | Masleid et al. | |
| 7,256,634 B2 | 8/2007 | Masleid | |
| 7,304,503 B2 | 12/2007 | Masleid et al. | |
| 7,310,008 B1 | 12/2007 | Masleid | |
| 7,330,054 B1 | 2/2008 | Masleid | |
| 7,336,103 B1 | 2/2008 | Masleid et al. | |
| 7,414,485 B1 | 8/2008 | Masleid | |
| 2001/0028278 A1 | 10/2001 | Ooishi | |
| 2001/0052623 A1 | 12/2001 | Kameyama et al. | |
| 2002/0039347 A1 | 4/2002 | Matsugatani et al. | |
| 2002/0087930 A1 | 7/2002 | Kanba | |
| 2002/0178415 A1 * | 11/2002 | Saraf | 714/726 |
| 2003/0189465 A1 | 10/2003 | Abadeer et al. | |
| 2004/0032290 A1 | 2/2004 | Lundberg | |
| 2004/0056685 A1 * | 3/2004 | Azam et al. | 326/95 |
| 2004/0104731 A1 | 6/2004 | Vollertsen | |
| 2004/0119501 A1 * | 6/2004 | Sabbavarapu et al. | 326/95 |
| 2004/0119503 A1 | 6/2004 | Jamshidi et al. | |
| 2004/0148111 A1 | 7/2004 | Gauthier et al. | |
| 2004/0257115 A1 * | 12/2004 | Bertram et al. | 326/98 |
| 2005/0184720 A1 | 8/2005 | Bernstein et al. | |
| 2005/0195642 A1 | 9/2005 | Schmitt | |
| 2005/0206432 A1 | 9/2005 | Tobita | |
| 2005/0212547 A1 | 9/2005 | Suzuki | |
| 2005/0248368 A1 * | 11/2005 | Bertram et al. | 326/98 |
| 2006/0220678 A1 | 10/2006 | Rozas et al. | |

FOREIGN PATENT DOCUMENTS

| | | |
|---|---|---|
| JP | 13188638 | 7/2001 |

OTHER PUBLICATIONS

Chen, G. et al., "Dynamic NBTI of a p-MOS Transistors and its Impact on MOSFET Scaling", IEEE Electron Device Letters, 2002.

Oner, et al. "A Compact Monitoring Circuit for Real-Time On-Chip Diagnosis of Hot-Carrier Induced Dedragration", Microelectronic test structures, Proceedings, IEEE International Conference in Monterey, CA Mar. 17, 1997-Mar. 20, 1997. pp. 72-76.

Peters, Laura, "NBTI: A Growing Threat to Device Reliability", Semiconductor International, Mar. 1, 2004, http//www.reed-elec-tronics.com/semiconductor/article/CA386329?Industryid=3033.

Reddy, V. et al., "Impact of Negative Bias Temperature Instability On Digital Circuit Reliabilty", 2002 IEEE International Reliability Physics Symposium Proceeding, Dallas, TX, Apr. 7, 2002-Apr. 11, 2002.

Webster's II New Riverside Dictionary, pp. 406-407, 1984.

* cited by examiner

Dynamic Circuit Latch 100

Dynamic Circuit Latch 200

Dynamic Circuit Latch 300

Dynamic Circuit Latch 400

Dynamic Circuit Latch 500

Dynamic Circuit Latch 600

SCANNABLE DYNAMIC CIRCUIT LATCH

BACKGROUND

1. Field of the Invention

Embodiments of this invention relate generally to the field of latches, and more specifically to latches well-suited to use with domino circuits.

2. Related Art

In high-speed integrated circuit (IC) applications, particularly microprocessors and microcontrollers, Domino circuits are used, where appropriate, to provide speed advantages over static logic. Such applications rarely include scannable latches for similar reasons, e.g., the inclusion of a scannable latch inserts substantial delay into the circuit. In order to provide full scan support, a circuit includes static latches twice per cycle, and the clocks are shut down twice per cycle, in order to avoid conflicts. While scannable latches are desirable, in order to allow for improved logic testing than is otherwise possible, the delay imposed is too significant.

SUMMARY

A dynamic circuit latch, having the functionality of a domino circuit and a transparent latch, without the delay associated with the inclusion of a separate latch element. Embodiments include a fast scannable footed Domino dyanmic latch. Also described is a fast scannable delay reset Domino dynamic latch. A fast scannable compound Domino dynamic latch is also described.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Scannable dynamic circuit latches are described. Reference will now be made in detail to several embodiments of the invention. While the invention will be described in conjunction with the alternative embodiment(s), it will be understood that they are not intended to limit the invention to these embodiments. On the contrary, the invention is intended to cover alternative, modifications, and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Figure 1:
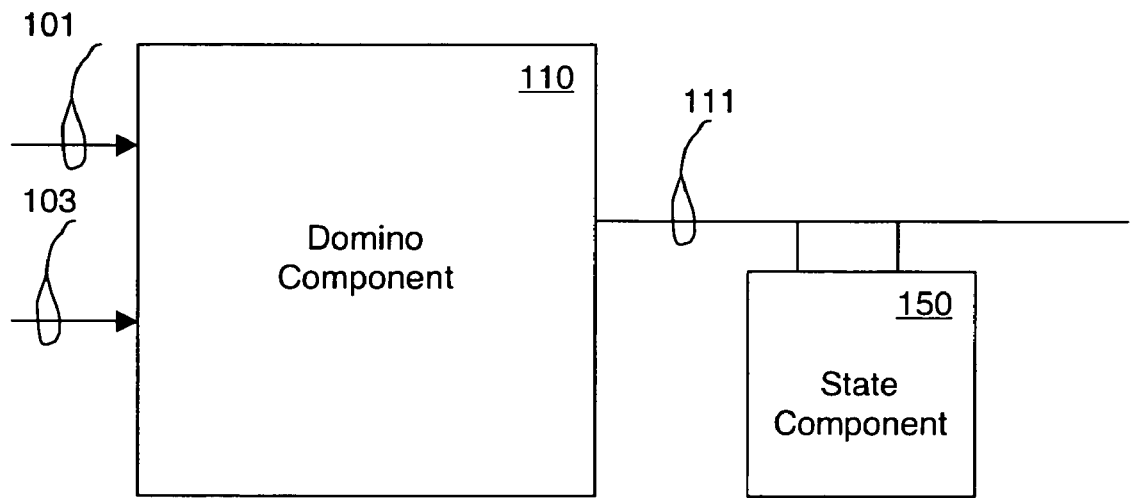
FIG. 1 is a block diagram of a dynamic circuit latch, in accordance with one embodiment of the present invention.

With reference to FIG. 1, a block diagram of a dynamic circuit latch 100 is depicted, in accordance with one embodiment of the invention. Dynamic circuit latch 100 has a domino component 110, which receives a clock signal 101 and an input signal 103, and produces an output signal 111. Domino component 110, in one embodiment, is a standard domino circuit with a slight modification. Any existing domino circuit can be improved through application of embodiments of the present invention; several specific embodiments are described below, with reference to FIGS. 2, 3, and 4. Dynamic circuit latch 100 also has a state component 150. State component 150 provides latching functionality for dynamic circuit latch 100. In one embodiment, described below with reference to FIG. 5, state component 150 functions as a transparent latch. In another embodiment, described below with reference to FIG. 6, state component 150 functions as a transparent latch while providing full scan support.

In operation, in one embodiment, dynamic circuit latch 100 acts as a combination of a domino circuit and a latch. The combination of domino component 110 and state component 150 provides both the blocking functionality of a latch, in that further inputs are prevented from affecting the present output, and the holding functionality, in that the previous state is retained at the output after the clock falls. However, dynamic circuit latch 100 imposes delay very similar to a standard domino circuit. As detailed below, the modifications made to the standard domino circuit in order to implement the embodiments of the present invention add very little delay, while the inclusion of state component 150, a side-load parasitic element, is much more efficient, in terms of delay, than including a separate series latch stage. The result is a single circuit with the functionality of both a domino circuit and a separate latch, which is free of the delay normally imposed by the latch.

Figure 2:
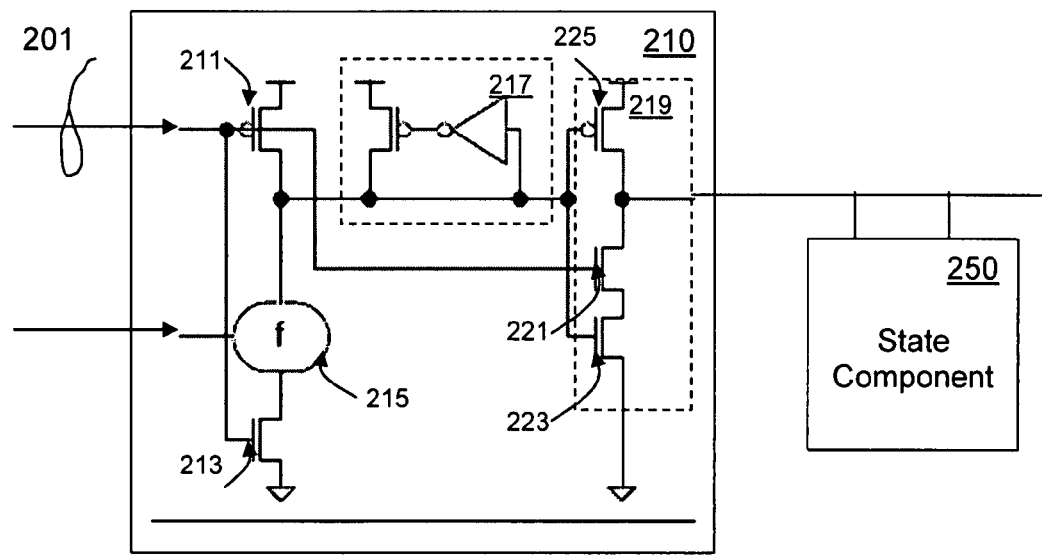
FIG. 2 is a block diagram of a dynamic circuit latch, including a footed domino circuit, in accordance with one embodiment of the present invention.

With reference now to FIG. 2, a block diagram of a dynamic circuit latch 200 is depicted, in accordance with one embodiment of the present invention. Dynamic circuit latch 200 includes a domino component 210 and a state component 250. In this embodiment, Domino component 210 is a modified form of a standard footed domino circuit. Domino component 210 includes a precharge device 211, shown as a p-channel metal-oxide semiconductor field effect transistor (PFET), a logic block 215, implementing a combinational function f, a foot device 213 to cut off input, shown as a n-channel metal-oxide semiconductor field effect transistor (NFET), a half-latch keeper 217, and an output buffer 219, with a PFET 225 and an NFET 223. It should be appreciated that unlike most footed domino circuits, Domino component 210 includes a clock input 221 to output buffer 219, the importance of which is discussed below.

In operation, in one embodiment, when clock signal 201 is high, Dynamic circuit latch 200 operates as an ordinary footed domino circuit. Clock element 221 is in the precharge path, not the evaluation path, and so does not cause functional delay. Some small delay penalty is introduced by the parasitic side-load of state component 250. Any additional delay incurred is substantially less than that caused by inclusion of a separate latch element. When clock signal 201 is low, foot device 213 cuts off input, precharge device 211 pulls up, and Domino component 210 goes into precharge. On output buffer 219, NFET 223 is shut off, and output buffer 219 cannot pull down. Further, the internal node is precharged, so PFET 225 is off, and output buffer 219 cannot pull up. As a result, Domino component 210 is in tristate, and the output state can be held by state component 250. Dynamic circuit latch 200 is functionally equivalent to a footed domino circuit followed by a transparent latch, but without the delay associated with the inclusion of a separate series latch element.

Figure 3:
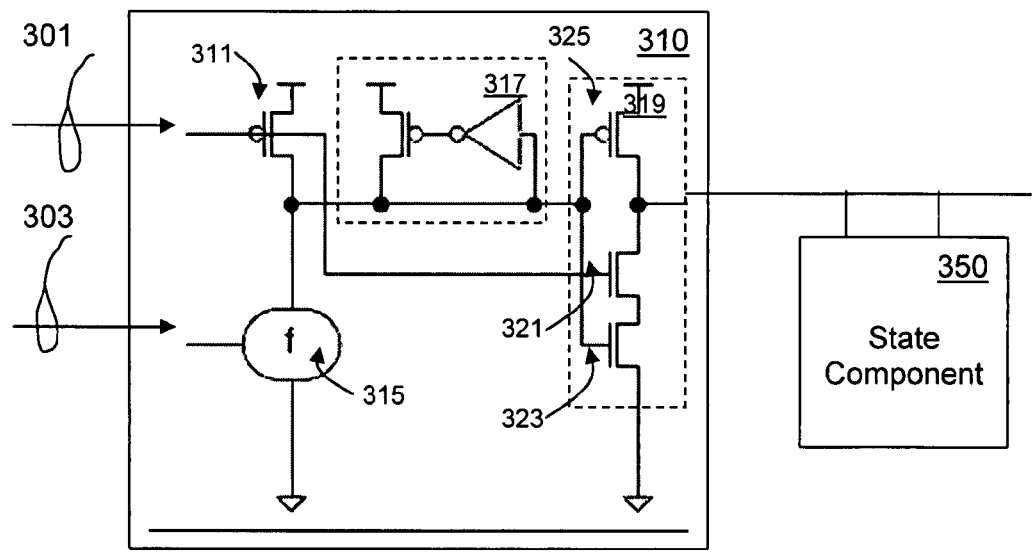
FIG. 3 is a block diagram of a dynamic circuit latch, including a delay reset domino circuit, in accordance with one embodiment of the present invention.

With reference now to FIG. 3, a block diagram of a dynamic circuit latch 300 is depicted, in accordance with one embodiment of the present invention. Dynamic circuit latch 300 includes a domino component 310 and a state component 350. In this embodiment, Domino component 310 is a modified form of a standard delay reset domino circuit. Domino component 310 includes a precharge device 311, shown as a p-channel metal-oxide semiconductor field effect transistor (PFET), a logic block 315, implementing a combinational function f, a half-latch keeper 317, and an output buffer 319, with a PFET 325 and an NFET 323. It should be appreciated that unlike most delay reset domino circuits, Domino component 310 includes a clock input 321 to output buffer 319, the importance of which is discussed below.

In operation, in one embodiment, Dynamic circuit latch 300 operates much like Dynamic circuit latch 200, described above with reference to FIG. 2. When clock signal 301 is high, Dynamic circuit latch 300 operates as an ordinary delay reset domino circuit. Clock element 321 is in the precharge path, not the evaluation path, and so does not cause functional delay. Some small delay penalty is introduced by the parasitic side-load of state component 350. Again, any additional delay incurred is substantially less than that caused by inclusion of a separate series latch element.

Unlike Domino component 210, above, Domino component 310 lacks a foot device to cut off input. In order to ensure that Dynamic circuit latch 300 goes into tristate, the normal rules for placement of a delay reset domino circuit must be enforced e.g., a delay reset domino circuit must always follow a footed circuit, in order to ensure that the delay reset domino circuit will be able to precharge. That constraint aside, however, Domino component 310 operates similarly to Domino component 210, above. When clock signal 301 is low, precharge device 311 pulls up, and Domino component 310 goes into precharge. On output buffer 319, NFET 323 is shut off, and output buffer 319 cannot pull down. Further, the internal node is precharged, so PFET 325 is off, and output buffer 319 cannot pull up. As a result, Domino component 310 is in tristate, and the output state can be held by state component 350. Dynamic circuit latch 300 is functionally equivalent to a delay reset domino circuit followed by a transparent latch, but without the delay associated with the inclusion of a separate series latch element.

Figure 4:
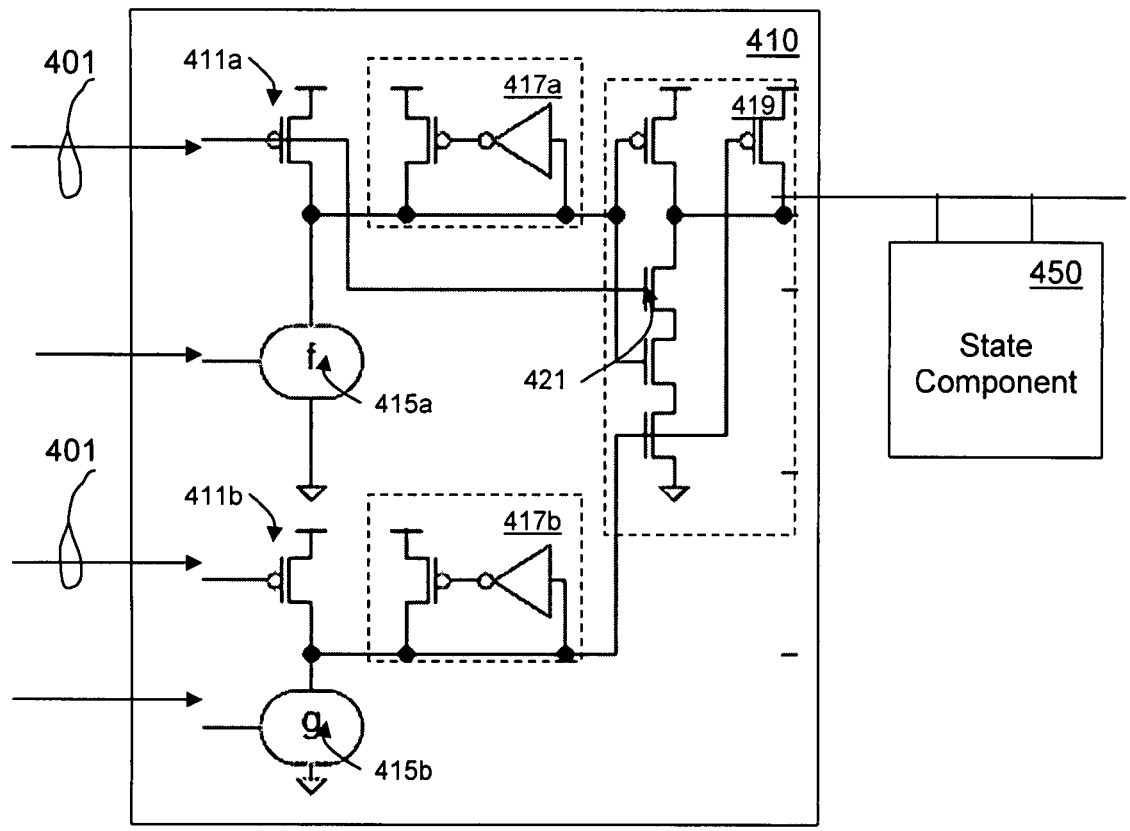
FIG. 4 is a block diagram of a dynamic circuit latch, including a compound domino circuit, in accordance with one embodiment of the present invention.

With reference now to FIG. 4, a block diagram of a dynamic circuit latch 400 is depicted, in accordance with one embodiment of the present invention. Dynamic circuit latch 400 includes a domino component 410 and a state component 450. In this embodiment, Domino component 410 is a modified form of a standard compound domino circuit. Domino component 410 includes several precharge devices 411a and 411b, shown as p-channel metal-oxide semiconductor field effect transistors (PFETs), several logic blocks 415a and 415b, for implementing combinational functions, f and g, several half-latch keepers 417a and 417b, and an output buffer 419. It should be appreciated that unlike most compound domino circuits, Domino component 410 includes a clock input 421 to output buffer 419, the importance of which is discussed below.

In operation, in one embodiment, Dynamic circuit latch 400 operates much like Dynamic circuit latch 300, described above with reference to FIG. 3. When clock signal 401 is high, Dynamic circuit latch 400 operates as an ordinary delay reset domino circuit. Clock element 421 is in the precharge path, not the evaluation path, and so does not cause functional delay. Some small delay penalty is introduced by the parasitic side-load of state component 450. Again, any additional delay incurred is substantially less than that caused by inclusion of a separate series latch element.

Domino component 410 differs from Domino component 310 in two important aspects. First, Domino component 410 allows for multiple logic blocks 415a and 415b, as per a normal compound domino circuit, meaning several logical operations can be performed within the circuit to produce output. Second, output buffer 419 is substantially different from output buffer 319. Output buffer 419 is a standard NAND gate, with the addition of clock input 421. Otherwise, operation of Domino component 410 is similar to that of Domino component 310. In this embodiment, Domino component 410 also lacks a foot device to cut off input. In order to ensure that Dynamic circuit latch 400 goes into tristate, the normal rules for placement of a delay reset compound domino circuit must be enforced, e.g., a delay reset compound domino circuit must always follow a footed circuit, in order to ensure that the delay reset compound domino circuit will be able to precharge. In another embodiment, Domino component 410 is implemented to include a plurality of foot devices, similar to foot device 213. When clock signal 401 is low, precharge device 411 pulls up, and Domino component 410 goes into precharge. Domino component 410 is put into in tristate, and the output state can be held by state component 450. Dynamic circuit latch 400 is functionally equivalent to a delay reset compound domino circuit followed by a transparent latch, but without the delay associated with the inclusion of a separate series latch element.

Figure 5:
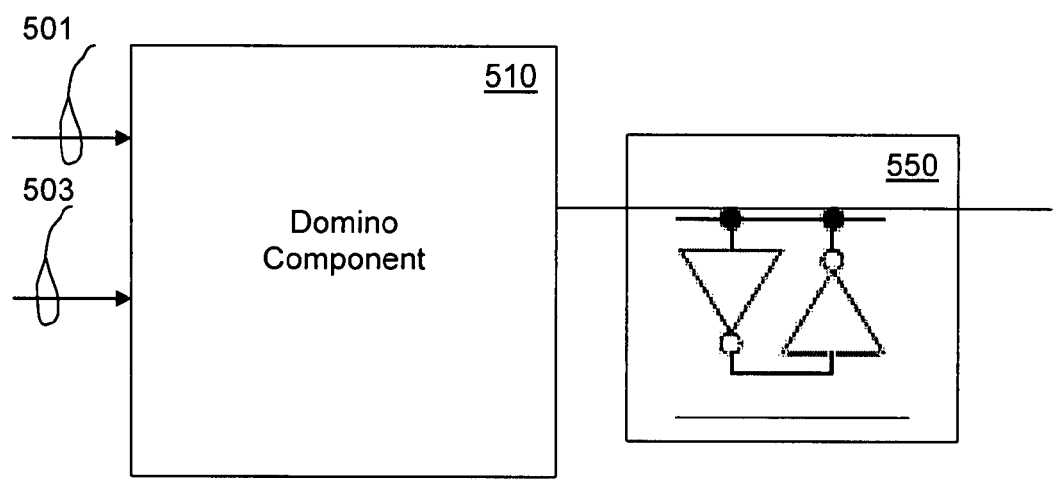
FIG. 5 is a block diagram of a dynamic circuit latch, including a series of inverters, in accordance with one embodiment of the present invention.

With reference now to FIG. 5, a block diagram of a dynamic circuit latch 500 is depicted, in accordance with one embodiment of the present invention. Dynamic circuit latch 500 includes a domino component 510 and a state component 550. Domino component 510 receives clock signal 501 and data signal 503 as inputs. Domino component 510 can be implemented, in several embodiments, as domino component 210, domino component 310, or domino component 410. When domino component 210 is used in conjunction with dynamic circuit 500, a dynamic footed domino circuit is described. When domino component 310 is used in conjunction with dynamic circuit 500, a dynamic delay reset domino circuit is described. When domino component 410 is used in conjunction with dynamic circuit 500, a dynamic compound domino circuit is described. In this embodiment, state component 550 is shown as a simple pair of inverters. This implementation, coupled with domino component 510, provides the functionality of a domino circuit followed by a transparent (non-scannable) latch.

Figure 6:
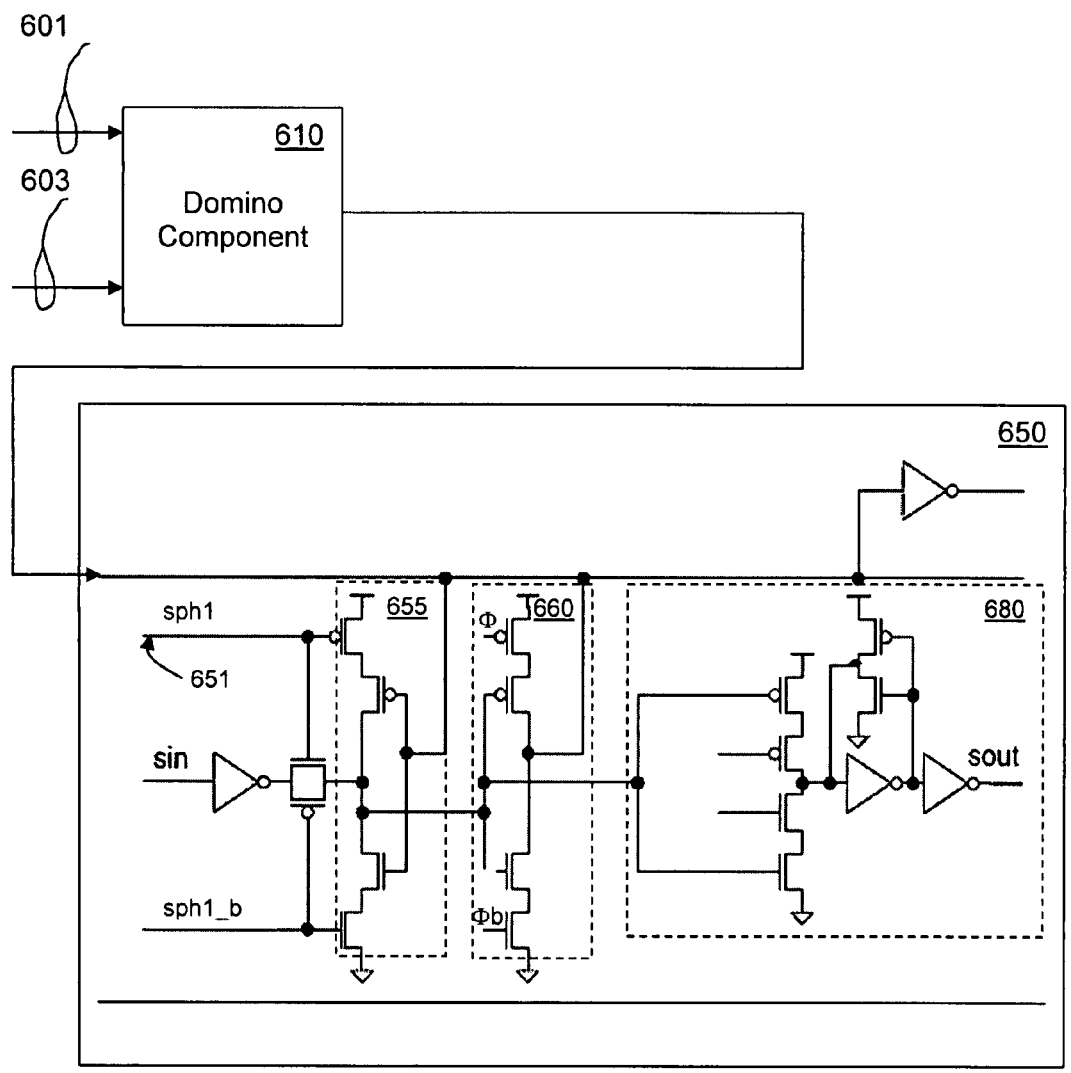
FIG. 6 is a block diagram of a dynamic circuit latch, including a fully scannable latch, in accordance with one embodiment of the present invention.

With reference now to FIG. 6, a block diagram of a dynamic circuit latch 600 is depicted, in accordance with one embodiment of the present invention. Dynamic circuit latch 600 includes a domino component 610 and a state component 650. Domino component 610 receives clock signal 601 and data signal 603 as inputs. Domino component 610 can be implemented, in several embodiments, as domino component 210, domino component 310, or domino component 410. When domino component 210 is used in conjunction with dynamic circuit 600, a scannable dynamic footed domino circuit is described. When domino component 310 is used in conjunction with dynamic circuit 600, a scannable dynamic delay reset domino circuit is described. When domino component 410 is used in conjunction with dynamic circuit 600, a scannable dynamic compound domino circuit is described. In this embodiment, state component 650 includes a pair of feedback inverters, first inverter 655 and second inverter 660, implemented as two tristate buffers. One embodiment also includes a slave latch 680, to allow the state of the output to be read at any time.

In operation, state component 650 provides full scanning and latching functionality for dynamic circuit latch 600. Scan-in and scan-out are shown as sin and sout, respectively. First inverter 655 is controlled by a separate scan clock, scan phase one signal (sph1) 651 and scan phase one bar (sph1_b). Second inverter 660 is clocked by the functional clock, clock signal 601 (Φ and Φb), such that when clock signal 601 is high, second inverter 660 goes into tristate, which minimizes the side load caused by state component 650, allowing dynamic circuit latch 600 to function as a normal domino circuit of a given type. When clock signal 601 is low, and scan is inhibited, first inverter 655 is activated, second inverter 660 is conducting, and the output state is held. When the scan clock is enabled, the held state can be overridden, and a scan-in value can be forced into the latch.

At any time, slave latch 680 can be used to monitor the state of state component 650 via the scan-out port, whether dynamic circuit latch 600 is in functional mode or in scan mode. Slave latch 680 is activated by a second set of scan clock signals.

The inclusion of state component 650 in dynamic circuit latch 600 allows for transparent latch functionality as well as full scan capability, while not incurring the delay that would result from including a separate series latch element behind a traditional domino circuit.

Again, it is appreciated that the discussion above is intended to be illustrative of several embodiments of the present invention. Other embodiments are possible, and will be apparent to one skilled in the art. Moreover, combinations of the above exemplary embodiments are desirable, and while not specifically enumerated herein, are intended as part of the present invention.

Embodiments of the present invention described above thus relate to a scannable dynamic circuit latch. While the present invention has been described in particular exemplary embodiments, the present invention should not be construed as limited by such embodiments, but rather construed according to the following claims and their equivalents.

What is claimed is:

1. A dynamic circuit latch comprising:
   a domino component, for receiving a clock signal and an input signal, and for producing an output signal; and
   a state component, coupled to the domino component, for retaining the output signal, wherein an output of said state component is coupled to an output of said domino component, comprising:
      a first tri-state buffer, wherein the first tri-state buffer is coupled to a first scan clock signal;
      a second tri-state buffer coupled to the first tri-state buffer, wherein the second tri-state buffer is coupled to the clock signal, and wherein the domino component and the state component are configured to assume a tri-state when induced by the clock signal, such that the output signal is held at the state component, and wherein the input signal cannot alter the output signal while so held, and wherein the first tri-state buffer and the second tri-state buffer are configured to function as an exposed, scannable latch when the domino component is in the tri-state, and wherein the first scan clock signal and the clock signal are separate clock signals; and
      a slave latch configured for monitoring the output signal, wherein the slave latch is coupled to a second scan clock signal.

2. The dynamic circuit latch of claim 1 free of the delay imposed by inclusion of a separate series latch circuit.

3. The dynamic circuit latch of claim 1, wherein the slave latch is coupled to the second tri-state buffer.

4. The dynamic circuit latch of claim 1, wherein the domino
   component comprises:
   a precharge component, for precharging the domino component;
   a function component, coupled to the precharge component, for performing a function with the input signal and producing the output signal;
   a keeper component, coupled to the precharge component, for holding the output signal from the function component; and
   an output component, coupled to the precharge component, for holding the output signal.

5. The dynamic circuit latch of claim 4, wherein the domino component further comprises:
   a foot component, coupled to the precharge component, for cutting off the input signal when induced by the clock signal.

6. The dynamic circuit latch of claim 1, wherein the domino component comprises:
   a plurality of precharge components;
   a plurality of function components, coupled to the plurality of precharge components, for performing a plurality of functions and producing a plurality of output signals;
   a plurality of keeper components, coupled to the plurality of precharge components, for holding the plurality of outputs signals; and
   an output component, coupled to the plurality of precharge components, for holding the output signal.

7. A scannable latch circuit comprising:
   a domino circuit comprising a data input port for receiving an input data signal and a clock input port for receiving a clock input wherein the domino circuit is configured to generate an output signal over an output port; and
   a scannable state component coupled to the output port, comprising:
      a first tri-state buffer circuit coupled to a scan-in port, coupled to the output port, and coupled to a first scan clock input;
      a second tri-state buffer circuit coupled to the first tri-state buffer circuit and coupled to the output port, and coupled to the clock input, wherein the first scan clock input and the clock input are coupled to separate clock inputs; and
      a scan-out read circuit coupled to the second tri-state buffer circuit, a scan-out port, and a second scan clock input;
   wherein the scannable state component, in a first clock mode, is configured to hold a signal state of the output port and, wherein further, signal transitions at the data input port do not alter the signal state.

8. The scannable latch circuit as described in claim 7 wherein the scannable state component comprises a scan-in port and a scan-out port.

9. The scannable latch circuit as described in claim 7 wherein the domino circuit comprises a footed domino circuit.

10. The scannable latch circuit as described in claim 7 wherein the domino circuit comprises a delay reset domino circuit.

11. The scannable latch circuit as described in claim 7 wherein the domino circuit comprises a compound domino circuit.

12. The scannable latch circuit as described in claim 7 wherein the domino circuit further comprises:
a precharge subcircuit;
a keeper subcircuit coupled to the precharge subcircuit; and
an output buffer subcircuit coupled to the keeper subcircuit and coupled to the precharge subcircuit wherein the output buffer subcircuit is for generating the output signal.

13. A dynamic circuit latch, comprising:
a domino component coupled to a clock port to receive a clock signal and an input port to receive an input signal, wherein the domino component is configured in a first clock state to produce an output at an output port, and wherein the domino component is configured in a second clock state to prevent the input from affecting the output; and
a state component coupled to the output port, comprising:
a first tri-state buffer circuit coupled to the scan-in port, coupled to a scan-clock input port, and coupled to a first scan clock signal; and
a second tri-state buffer circuit coupled to the first tri-state buffer, coupled to a functional clock input port to receive the clock signal, coupled to a second scan clock signal, and coupled to the clock signal wherein the first scan clock signal and the clock signal are separate clock signals,
wherein the state component is configured in the first clock state to inhibit conduction through the state component, and wherein the state component is configured in the second clock state to hold the output.

14. The dynamic circuit latch of claim 13 wherein the domino component comprises a footed domino circuit.

15. The dynamic circuit latch of claim 13 wherein the domino circuit comprises a delay reset domino circuit.

16. The dynamic circuit latch of claim 13 wherein the domino circuit comprises a compound domino circuit.

17. The dynamic circuit latch of claim 16 wherein the compound domino circuit comprises a footed compound domino circuit.

18. The dynamic circuit latch of claim 16 wherein the compound domino circuit comprises a delay reset compound domino circuit.

19. The dynamic circuit latch of claim 13 wherein the state element comprises:
a scan-in read circuit coupled to a scan-in port and coupled to the output port; and
a scan-out read circuit coupled to the scan-in read circuit and coupled to a scan-out port for outputting a held value.

20. The dynamic circuit latch of claim 13 wherein the state element further comprises:
a scan-out read circuit coupled to the second tri-state buffer circuit and coupled to the scan-out port.

21. The dynamic circuit latch of claim 13 wherein the domino component farther comprises:
a precharge subcircuit;
a keeper subcircuit coupled to the precharge subcircuit; and
an output buffer subcircuit coupled to the keeper subcircuit and coupled to the precharge subcircuit wherein the output buffer subcircuit is for generating the output signal.

22. The dynamic circuit latch of claim 21 wherein the first tri-state buffer circuit is coupled to the output port and wherein the second tri-state buffer circuit is coupled to the output port and further comprises:
a scan-out read circuit coupled to the second tri-state buffer circuit and coupled to a scan-out port.

23. The dynamic circuit latch of claim 16 wherein the compound domino component comprises a plurality of functional units each coupled to a plurality of half keeper circuits, wherein each functional unit has a separate input.

24. A dynamic circuit latch comprising:
domino means for producing an output signal, wherein the domino means is configured to receive a clock signal and an input signal; and
state means for retaining the output signal, wherein an output of the state means is coupled to an output of the domino means and wherein the domino means and the state means are configured to assume a tri-state when induced by the clock signal, such that the output signal is held at the state means, and wherein the input signal cannot alter the output signal while so held, the state means comprising:
first tri-state buffer means, wherein the first tri-state buffer means is coupled to a first scan clock signal; and
second tri-state buffer means coupled to the first tri-state buffer means and coupled to a second scan clock signal, wherein the second tri-state buffer means is coupled to the clock signal, and wherein the first tri-state buffer means and the second tri-state buffer means are configured to function as an exposed, scannable latch when the domino means is in the tri-state, and wherein the first scan clock signal and the clock signal are separate clock signals.

25. The dynamic circuit latch of claim 24 free of the delay imposed by inclusion of a separate series latch circuit.

26. The dynamic circuit latch of claim 24, further comprising:
slave latch means for allowing monitoring of the output signal, coupled to the second tri-state buffer means.

27. The dynamic circuit latch of claim 24, wherein the domino means comprises:
means for precharging the domino means;
means for performing a function with the input signal and producing the output signal, coupled to the means for precharging;
means for holding the output signal the means for performing a function, coupled to the means for precharging; and
means for holding the output signal, coupled to the means for precharging.

28. The dynamic circuit latch of claim 27, wherein the domino means further comprises:
means for cutting off the input signal when induced by the clock signal, coupled to the means for precharging.

29. The dynamic circuit latch of claim 27, wherein the means for precharging comprises a plurality of precharge components, wherein the means for performing a function with the input signal and producing the output signal comprises a plurality of function components, coupled to the plurality of precharge components, for performing a plurality of functions and producing a plurality of output signals, and wherein the means for holding the output signal comprises a plurality of keeper components, coupled to the plurality of precharge components, for holding the plurality of output signals, wherein the means for holding the output signal is coupled to the plurality of precharge components.

* * * * *